United States Patent
Wen

Patent Number: 5,904,527
Date of Patent: May 18, 1999

[54] FABRICATING METHOD FOR A ROM DEVICE USING A SHOCKLY DIODE

[76] Inventor: Jemmy Wen, Hsinchu, Taiwan

[21] Appl. No.: 08/906,314

[22] Filed: Aug. 4, 1997

[30] Foreign Application Priority Data

Mar. 27, 1997 [TW] Taiwan ................................ 86103968

[51] Int. Cl.$^6$ ............................................... H01L 21/8246
[52] U.S. Cl. ........................................... 438/278; 438/237
[58] Field of Search ..................... 438/130, 237, 438/275, 276, 277, 278

[56] References Cited

U.S. PATENT DOCUMENTS

| | | | |
|---|---|---|---|
| 5,378,649 | 1/1995 | Huang | 438/278 |
| 5,441,907 | 8/1995 | Sung et al. | 438/237 |
| 5,510,288 | 4/1996 | Hong | 438/278 |
| 5,550,075 | 8/1996 | Hsu et al. | 438/237 |

Primary Examiner—Chandra Chaudhari

[57] ABSTRACT

A fabricating method for a ROM device uses the Shockly diode as a memory cell in the ROM device. In the present invention, the current of the memory cell is larger than that of a convention one. In the conventional ROM device, the code is programmed by making use of the channel transistor as the memory cell and implanting. In the present invention, the code is programmed by defining contact windows of the ROM device to prevent the ROM device from the shortcomings of limited current. In addition, the memory cells of the ROM device of a Shockly diode are isolated by an insulating layer, resulting in a smaller area for the device and improved integrity.

21 Claims, 8 Drawing Sheets

FABRICATING METHOD FOR A ROM DEVICE USING A SHOCKLY DIODE

BACKGROUND OF THE INVENTION

1. Field of the Invention

The present invention relates in general to the fabrication method for a ROM device, and more particularly to a ROM device which uses a shockly diode to form a memory cell and a method of fabricating the same.

2. Description of the Related Art

ROM devices are widely used in mini-computer systems, such as micro-processor systems, to store system data. For example, the BIOS system uses ROM devices. The fabricating processes for a ROM device can take a lot of time and require extensive processing. As a result, customers generally pass programs to be included in their system to a factory that fabricates ROM devices, so that the factory can encode the programs into the ROM devices to complete the products.

Most ROM devices have similar structures, and differ only in the data which is stored during the programming step. Typically, once the integrated circuit (IC) factory receives a programming order from a customer, a mask is produced to perform the programming. This allows production to be finished rapidly, thus reducing manufacturing time and providing better service to the customers. Therefore, ROMs that are post-programmed with the aid of a mask are commonly used in the art.

Figure 1A:
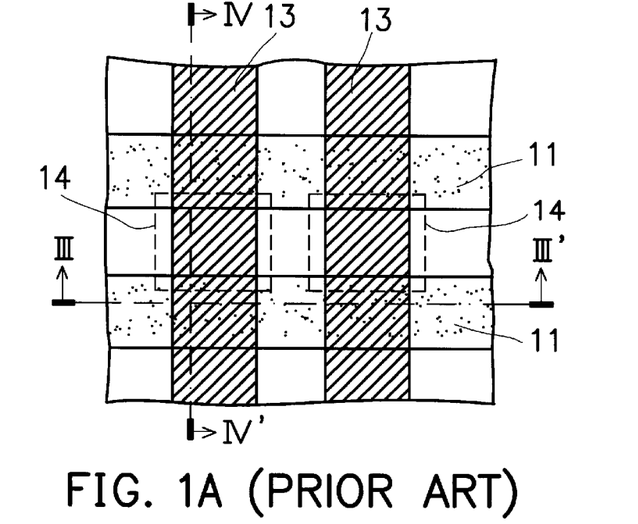
FIG. 1A (Prior Art) is a top view of a conventional ROM.
Figure 1B:
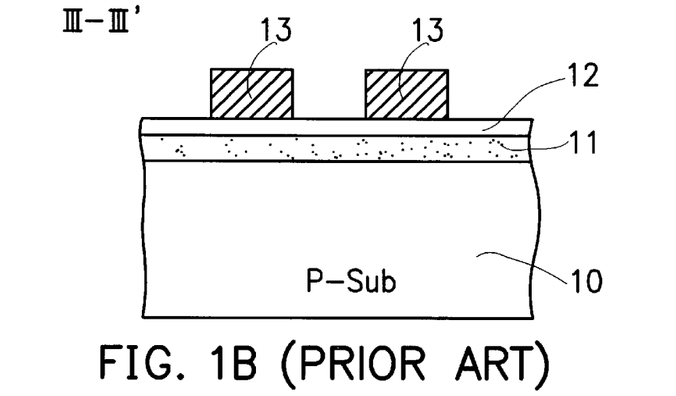
FIG. 1B (Prior Art) is a front cross-sectional view of a conventional ROM.
Figure 1C:
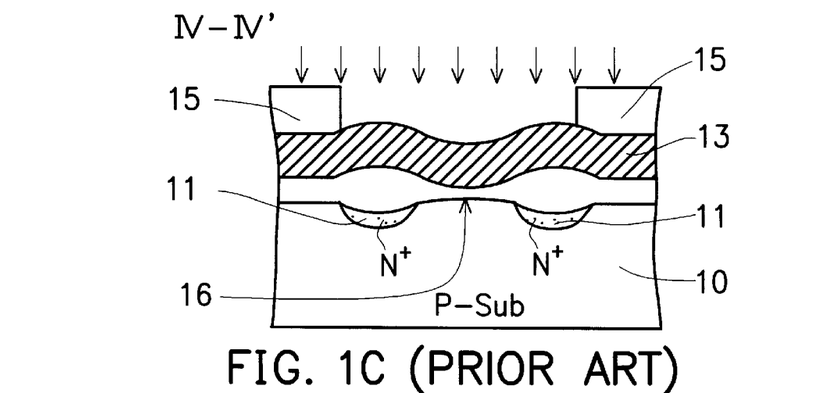
FIG. 1C (Prior Art) is a side cross-sectional view of a conventional ROM.

In general, channel transistors are used as the memory cells in the ROM. In the programming process, specific channel regions of the channel transistors are selectively implanted with impurities to modify the threshold voltages of the transistors. This controls the conductivity of the memory cell. For a detailed description, reference is made to FIGS. 1A through 1C, in which a conventional ROM device is illustrated. FIG. 1A is a top view of a portion of the known ROM device. FIG. 1B is a front view of a portion of the known ROM device. FIG. 1C is a cross-sectional view of the known ROM device.

The conventional ROM device includes a substrate 10, a plurality of bit lines (BL) 11, an oxide layer 12, and a plurality of word lines 13. Substrate 10 comprises, for example, a P-type substrate. The bit lines 11, oxide layer 12, and the word lines 13 are formed on the substrate 10. As shown in FIG. 1A, the region defined by the dotted line is forms a memory cell 14. The data (in binary form such as "0" or "1") is stored in the memory cell by implanting the channel region 16 with impurities.

As shown in FIG. 1C, an N-type dopant, for example, arsenic ions, is doped on the substrate to form bit lines 11, which are arranged with the same distance between each other. Channel region 16 is formed between adjacent bit lines 11. Next, oxide layer 12 is formed on a surface of the bit lines 11 and channel regions 16 using an oxidation process. A conductive layer of, for example, heavily doped polysilicon, is formed over the substrate 10 using a photolithography and etching process to form word lines 13, cross the bit lines 11. Then, channel transistors are formed to complete the partially manufactured conventional ROM.

To program the partially manufactured ROM, a series of continuous programming steps are performed. A mask 15 is formed over the partially completed ROM, leaving the channel region 16 which is to be encoded exposed. Then, a P-type dopant, such as boron, is implanted to form the code. The type of the implanted dopant selected depends on the characteristics of the transistor.

In the conventional ROM described above, the memory cell of the ROM is formed by the channel transistor. The fabricating processes are complicated and the step of code implanting must be formed before the channel transistor is finished. In addition, the area of the MOS device is difficult to minimize. For example, the punch through phenomenon may occur when minimizing the area of the MOS device. Thus, the integrity of the device is limited and it is difficult to improve the integrity.

SUMMARY OF THE INVENTION

It is therefore an object of the invention to provide a fabricating method for a ROM device using a Shockly diode. Using a standard Shockly diode to form a memory cell of a ROM can minimize the scale of the device. The present invention finishes the encoding process based on whether a contact window is formed in the memory cell to define a 'turning on' or 'turning off' memory cell. Owing to the low reverse current when the memory cell of the Shockly diode is off, the present invention can be applied to ordinary conditions.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, a fabricating method for a ROM device using a Shockly diode comprises fabricating processes as follows:

(a) a heavily doped layer with a second type dopant, a lightly doped layer with a first type dopant, a lightly doped layer with the second type dopant, and a heavily doped layer with the first type are formed over a plate in turns by a method of epitaxial fabrication;

(b) the heavily doped layer with the second dopant, the lightly doped layer with the first dopant, the lightly doped layer with the second dopant, and the heavily doped layer with the first dopant are patterned to form plural parallel bit lines in a first direction;

(c) a first insulating layer is formed on the above layer;

(d) the first insulating layer, the heavily doped layer with the first type dopant, the lightly doped layer with the second type dopant, and the lightly doped layer with the first type dopant are patterned to form plural first contact windows and the heavily doped layer with the second dopant is exposed;

(e) plural spaced walls are formed on the side wall of the first contact windows;

(f) the first insulating layer and the spaced walls are used as masks, and then a second type dopant is doped through the first contact windows into the heavily doped layer with the second type dopant to form diffusion regions with the second type dopant;

(g) the first insulating layer is patterned to form plural second contact windows such that the heavily doped layer with the first type dopant is exposed partly;

(h) a conducting layer is formed on the first insulating layer, wherein the conducting layer fills the second contact windows and the first contact windows; and (i) the conducting layer is patterned to form conducting regions on the first contact windows and to form plural parallel word lines in a second direction, wherein the word lines and the bit lines intersect at an angle.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

Figure 2A:
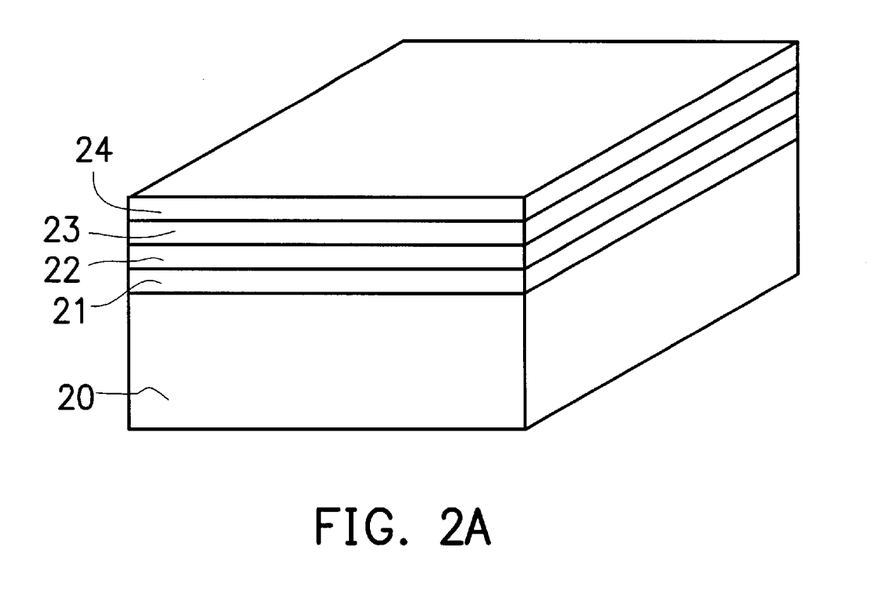
FIGS. 2A to 2P are cross-sectional views showing the process step of a preferred embodiment of a ROM device using a Shockly diode consistent with the present invention.
Figure 2B:
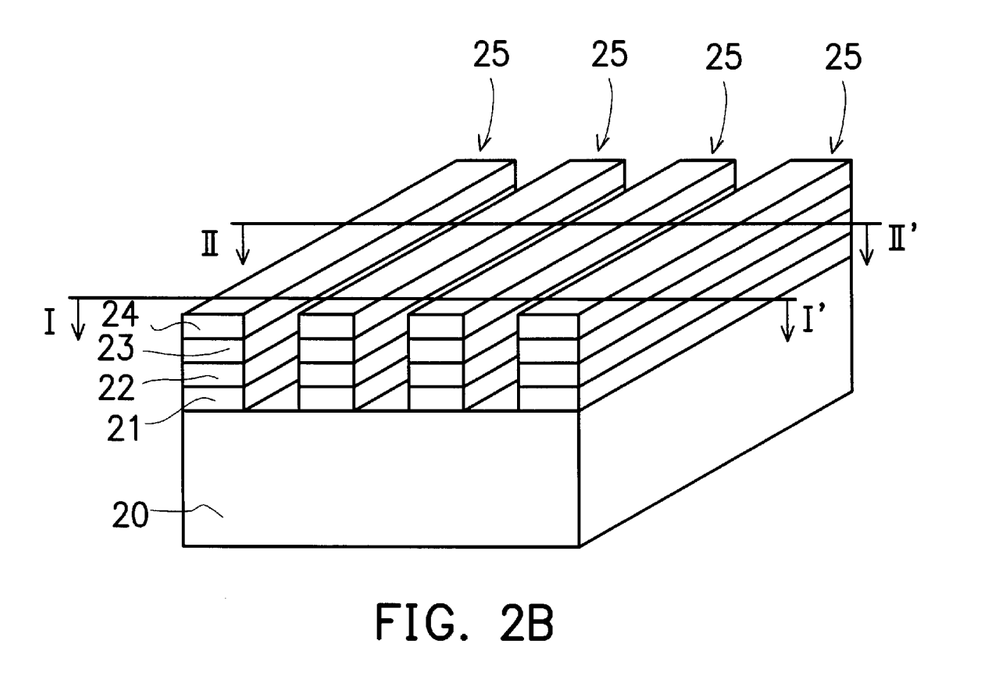

Referring to FIGS. 2A to 2I, the cross-sectional views show the processing steps of one embodiment of a ROM device using a Shockly diode consistent with the present invention. Referring first to FIGS. 2A and 2B, a plate 20 is provided. The plate 20 may be an insulating layer or a silicon substrate doped with a first type dopant. The insulating layer may be a silicon oxide layer or a silicon nitride layer. In the preferred embodiment, the plate 20 is an insulating layer. Four doping layers are formed over the plate 20 in turns by the method of epitaxial fabrication. For example, a heavily doped layer 21 of a second type dopant is formed over the plate 20, wherein the density is about $10^{20}$ atoms/cm$^3$; a lightly doped layer 22 with the first type dopant is formed again, wherein the density is about $10^7$ atoms/cm$^3$; then a lightly doped layer 23 with the second type dopant is formed, wherein the density is about $10^{16}$ atoms/cm$^3$; and finally a heavily doped layer 24 with the first type dopant is formed, wherein the density is about $10^{20}$ atoms/cm$^3$. By a lithography and etching method, the heavily doped layer 21 of the second type dopant, the lightly doped layer 22 of the first type dopant, the lightly doped layer 23 with the second type dopant, and the heavily doped layer 24 with the first type dopant are patterned to form plural parallel bit lines 25 as shown in FIG. 2B. The current gain of the present invention will be larger than 1.

The ROM device using a Shockly diode consistent with the present invention forms trenches in the bit lines 25 of the ROM array to connect the heavily doped layer 21 with the second type dopant. From FIGS. 2C to 2I, there are two cross-sectional views for each Figure. The left view of each Figure shows the cross-section I—I' of FIG. 2B. The left view of each Figure shows the fabricating processes of a conducting region which is connected to the heavily doped layer 21 with the second type dopant of the bit lines 25. The right view of each Figure shows the cross-section II—II' of FIG. 2B. The right view of each Figure shows the fabricating processes of the memory array.

Figure 2C:
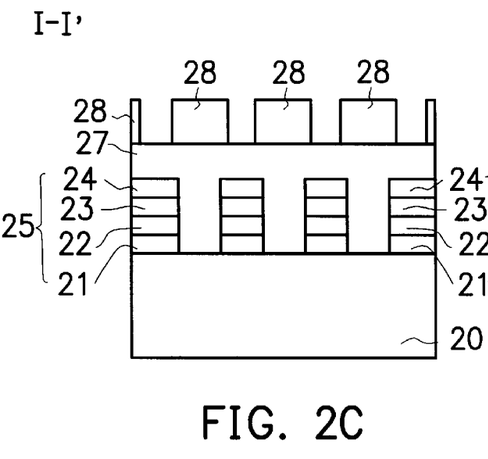
Figure 2D:
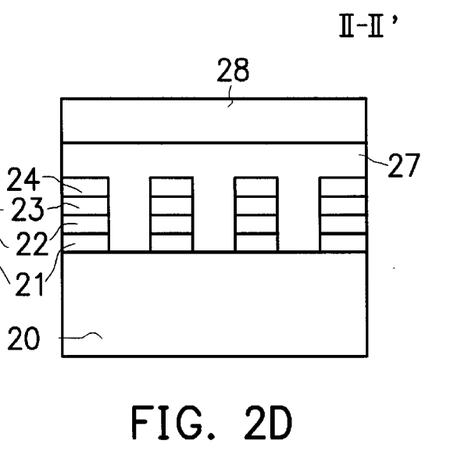

Referring to FIG. 2C next, an insulating layer 27 is formed over the above surface. For example, the insulating layer may be formed first by depositing a silicon oxide layer or silicon nitride layer with the method of chemical vapor deposition (CVD). Then, a spin-on-glass (SOG) or chemical mechanical polishing (CMP) method is used to form the planarized insulating layer 27. Next, the conducting region of the bit lines are fabricated. A photo-resist layer 28 is formed over the insulating layer 27. Then, the photo-resist layer 28 is patterned to exposed the insulating layer 27 above the heavily doped layer 21 with the second type dopant. The insulating layer 27, the heavily doped layer 24 with the first type dopant, the lightly doped layer 23 with the second type dopant, the lightly doped layer 22 with the first type dopant, and the heavily doped layer 21 with the second type dopant are anisotropically etched by using the photo-resist layer 28 as a mask to form plural contact windows 30 which exposed the heavily doped layer 21 with the second type dopant. Then, the photo-resist layer 28 is removed to have FIG. 2D.

Figure 2E:
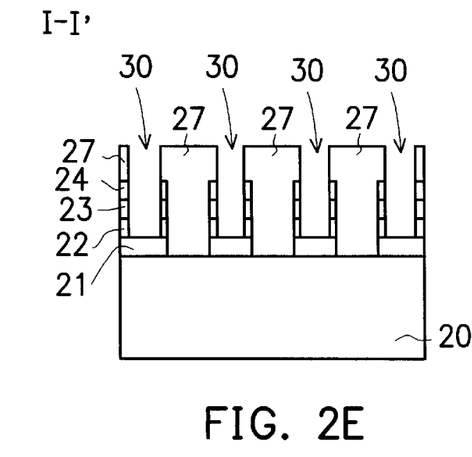
Figure 2F:
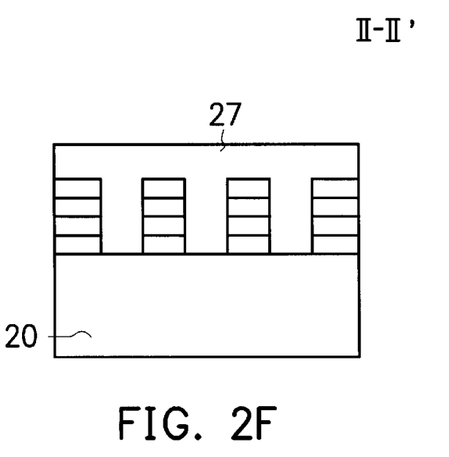

Referring to FIG. 2E, an insulating layer 32 is formed on the surface of the insulating layer 27, the surface of the heavily doped layer 21 with the second type dopant, and the side wall of the contact windows 30. The insulating layer 32 is an silicon oxide layer or a silicon nitride layer, which is formed, for example, by chemical vapor deposition. Then, the insulating layer 32 on the surface of the heavily doped layer 21 with the second type dopant is removed by anisotropically etching. Therefore, a spaced wall 33 is formed on the surface of the side wall of the contact window 30 as shown in FIG. 2F.

Figure 2G:
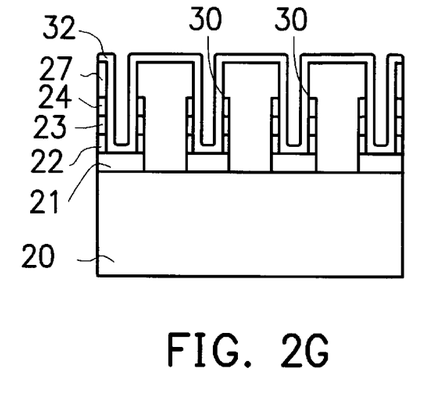

Referring to FIG. 2G, using the insulating layer 27 and the spaced wall 33 as masks, a second type dopant is doped from the contact windows 30 into the heavily doped layer 21 with the second type dopant to form diffusion regions 34 with the second type dopant.

Figure 2H:
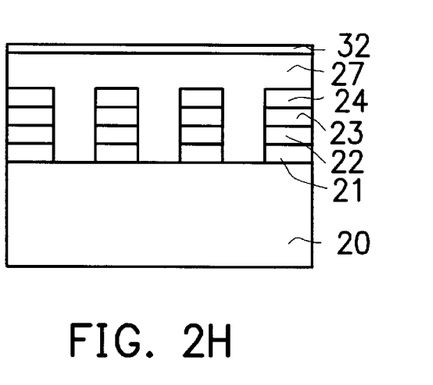

Referring to FIG. 2H, the memory array is fabricated in turn. The encoding process is progressed first by forming contacts to define the codes. For example, the insulating layer 27 is patterned to form plural contact windows 36 and expose partly the heavily doped layer 24 with the first dopant. The heavily doped layer 24 with the first type dopant, which has a contact window 36 on it, is a turned on memory cell 100. The memory cell 100 has a stored logic '1'. The heavily doped layer 24 with the first type dopant, which has no contact window 36 on it, is a turned off memory cell 102. The memory cell 102 has a stored logic '0'.

Figure 2I:
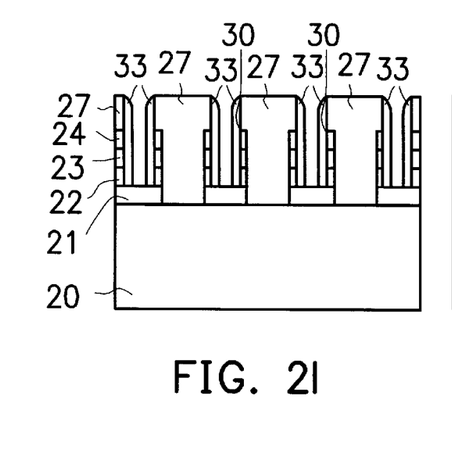
Figure 2J:
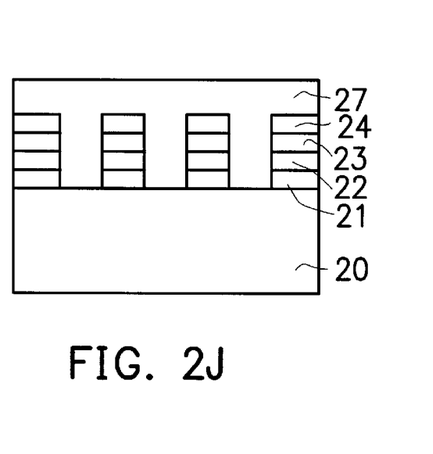
Figure 2K:
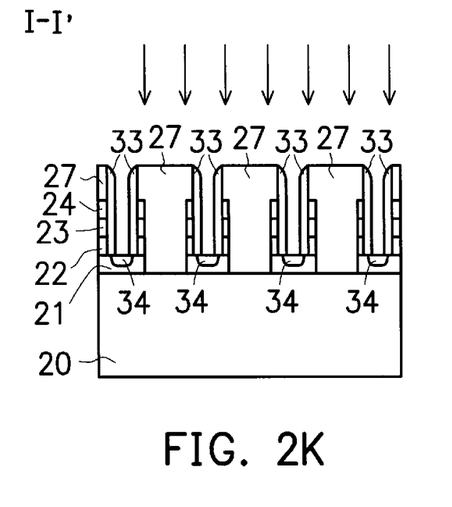
Figure 2L:
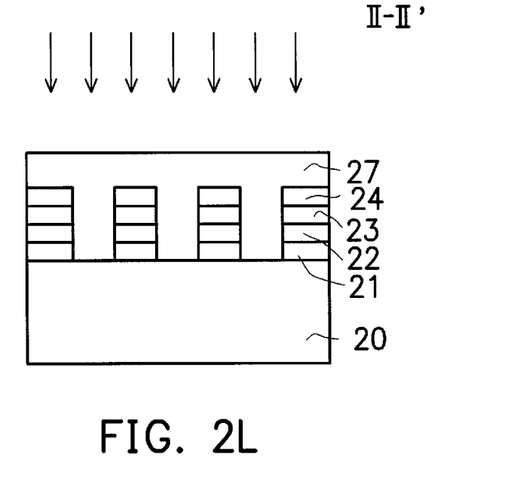
Figure 2M:
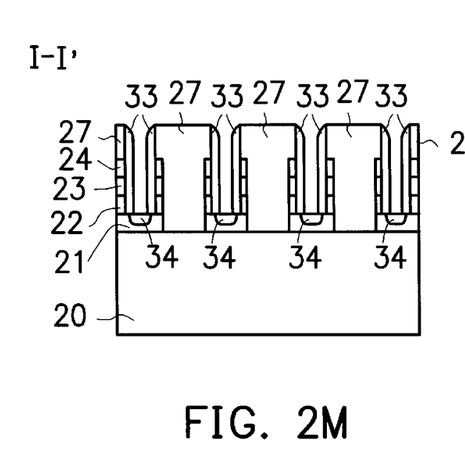
Figure 2N:
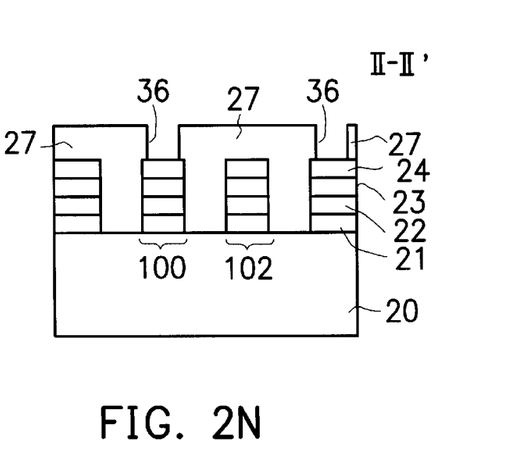
Figure 2O:
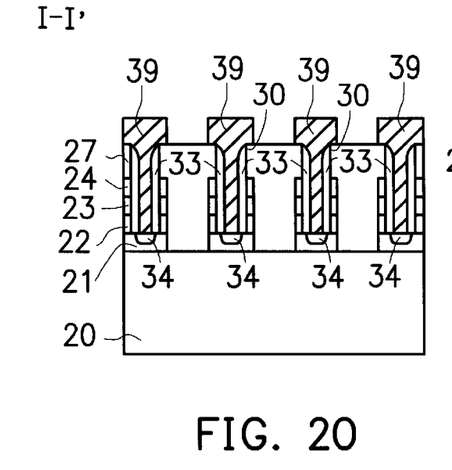
Figure 2P:
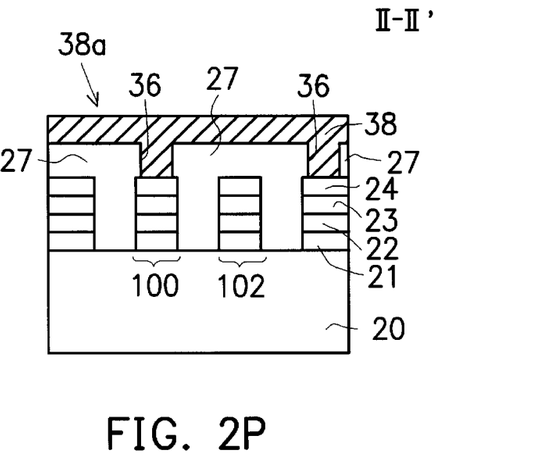
Figure 3:
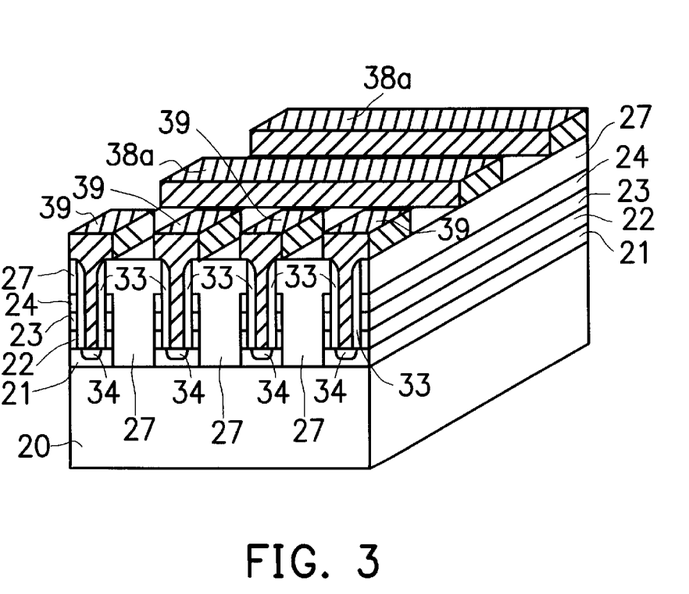
FIGS. 3 is a tri-dimensional view of a ROM device using a Shockly diode showing a preferred embodiment consistent with the present invention.

Referring to FIG. 2I, a conducting layer 38 is formed on the insulating layer 27. The conducting layer 38 fills the contact window 36 and the contact window 30 above the heavily doped layer 21 with the second dopant. The conducting layer 38 is, for example, a heavily doped polysilicon layer or a metal layer. Then, the conducting layer 38 is patterned to form plural parallel word lines 38a and conducting regions 39 on the contact windows 30. The word lines 38a and the bit lines 25 intersect at an angle about perpendicular to each other. Each cross part of the word line 38*a* and the bit line 25 forms a memory cell. A tridimensional view of a ROM device using a Shockly diode showing the embodiment consistent with the present invention is shown as FIG. 3.

In this embodiment, if the first type dopant is a P-type dopant than the second type dopant is a N-type dopant, and if the first type dopant is a N-type dopant than the second type dopant is a P-type dopant.

Figure 4A:
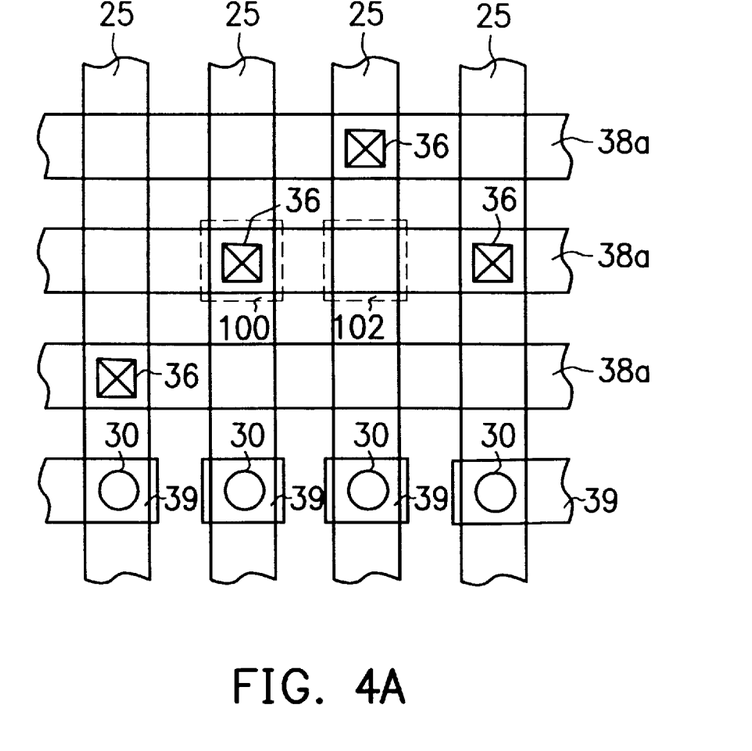
FIG. 4A is a top view in part of a ROM device using a Shockly diode consistent with the present invention.
Figure 4B:
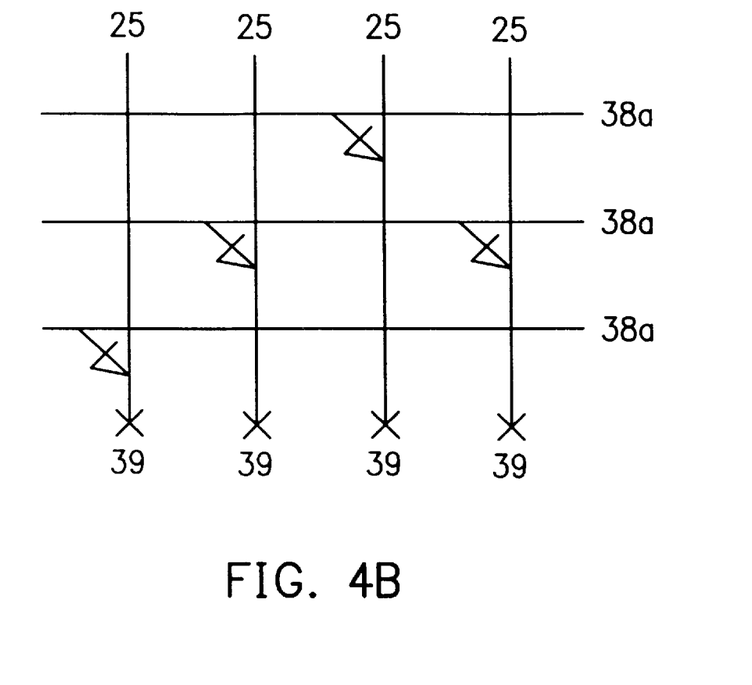
FIG. 4B is an equi-circuit of a ROM device using a Shockly diode consistent with the present invention.

In accordance with this embodiment of the invention, the top view of part of a ROM device using a Shockly diode is shown in FIG. 4A and the equi-circuit of a ROM device using a Shockly diode is shown in FIG. 4B. The cross part of the word line 38*a* and the bit line 25 is a memory cell. If the memory cell includes a contact window 36, for example, signed with X, than it is a turned-on memory cell 100. If the memory cell includes no contact window 36, than it is a turned-off memory cell 102.

Figure 5:
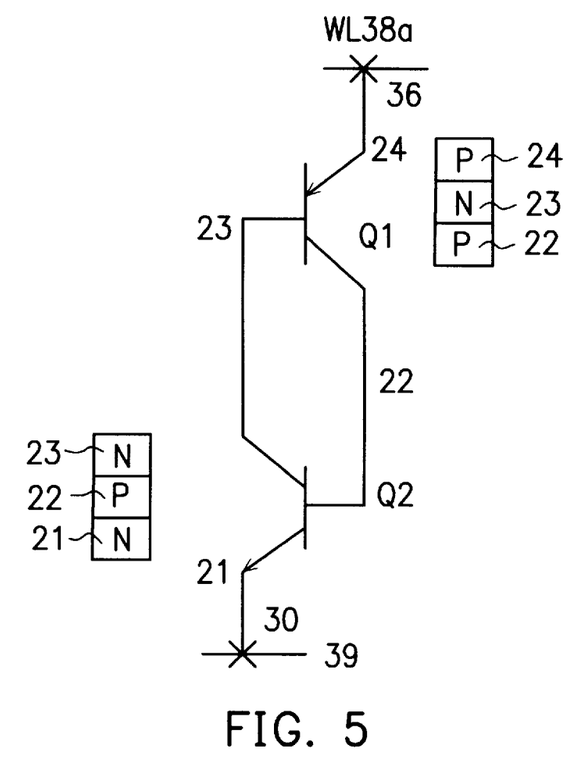
FIG. 5 is a circuit of a memory cell of a ROM device using a Shockly diode consistent with the present invention.
Figure 6:
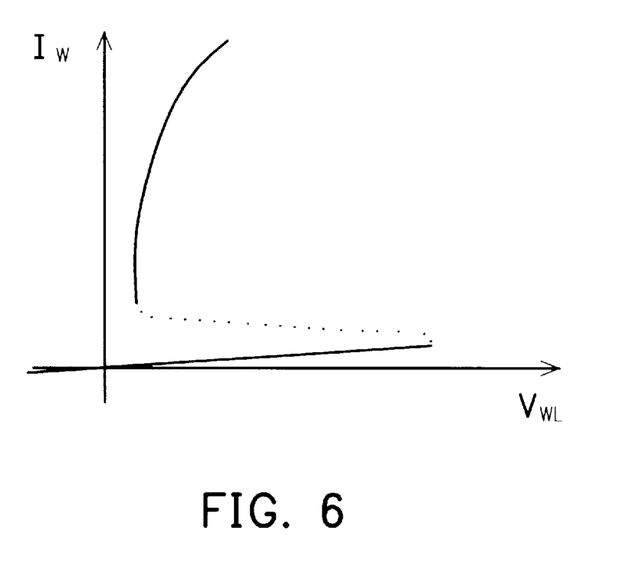
FIG. 6 is the characteristic diagram of the voltage and current of the word-line consistent with the present invention.

In the following description, the first type dopant is a P-type dopant and the second type dopant is a N-type dopant. The ROM device forms two parasitic bipolar transistors as shown in FIG. 5. If a positive voltage is input on the word line 38*a*, the potential $V_{24-23}$ of the transistor Q1 and the potential $V_{22-21}$ will be forward biased. Then, the Shockly diode will be turned on and the current flows from the contact window 30 of the heavily doped layer 21 with the N-type dopant to the conducting region 39. The magnitude of the current can be read from the conducting region 39. If the voltage is not input on the word line 38*a*, than the Shockly diode will be turned off and the current cannot be read from the conducting region 39. As can be seen from the above description, the current flows from the word line 38*a* to the contact window 36 of the turned on memory cell to turn on the Shockly diode. Then, the current flows from the heavily doped layer 21 of the N-type dopant to the conducting region 39 of the contact window 30. The current can be read from the conducting region 39. FIG. 6 is the characteristic diagram of the voltage and current of the word-line according to the ROM device using Shockly diode consistent with the present invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A fabricating method of a ROM device, comprising the steps of:

(a) forming a heavily doped layer with a second type dopant, followed by a lightly doped layer with a first type dopant, followed by a lightly doped layer with the second type dopant, and followed by a heavily doped layer with the first type dopant over a plate by a method of epitaxial fabrication;

(b) patterning the heavily doped layer with the second type dopant, the lightly doped layer with the first type dopant, the lightly doped layer with the second type dopant, and the heavily doped layer with the first type dopant to form plural parallel bit lines in a first direction:

(c) forming a first insulating layer;

(d) patterning the first insulating layer, the heavily doped layer with the first type dopant, the lightly doped layer with the second type dopant, and the lightly doped layer with the first type dopant to form plural first contact windows such that the heavily doped layer with the second dopant is exposed;

(e) forming plural spaced walls on the side wall of the first contact windows;

(f) doping a second type dopant through the first contact windows into the heavily doped layer with the second type dopant to form diffusion regions with the second type dopant using the first insulating layer and the spaced walls as masks;

(g) patterning the first insulating layer to form plural second contact windows such that the heavily doped layer with the first type dopant is selectively exposed;

(h) forming a conducting layer on the first insulating layer, wherein the conducting layer fills the second contact windows and the first contact windows; and (i) patterning the conducting layer to form conducting regions on the first contact windows and to form plural parallel word lines in a second direction, wherein the word lines and the bit lines intersect at an angle.

2. A fabricating method according to claim 1, wherein the first type dopant is a P-type dopant and the second type dopant is a N-type dopant.

3. A fabricating method according to claim 1, wherein the first type dopant is a N-type dopant and the first type dopant is a P-type dopant.

4. A fabricating method according to claim 1, wherein the plate in said step (a) is a silicon oxide layer.

5. A fabricating method according to claim 1, wherein the plate in said step (a) is a silicon nitride layer.

6. A fabricating method according to claim 1, wherein the plate in said step (a) is a silicon substrate doped with the first type dopant.

7. A fabricating method according to claim 1, wherein the density of the heavily doped layer with the second type dopant in said step (a) is about $10^{20}$ atoms/cm$^3$.

8. A fabricating method according to claim 1, wherein the density of the lightly doped layer with the first type dopant in said step (a) is about $10^{17}$ atoms/cm3.

9. A fabricating method according to claim 1, wherein the density of the lightly doped layer with the second type dopant in said step (a) is about $10^{16}$ atoms/cm$^3$.

10. A fabricating method according to claim 1, wherein the density of the heavily doped layer with the first type dopant in said step (a) is about $10^{20}$ atoms/cm$^3$.

11. A fabricating method according to claim 1, wherein the first insulating layer in said step (c) is a silicon oxide layer formed by chemical vapor deposition followed by planarization.

12. A fabricating method according to claim 11, wherein the planarization method is a chemical mechanical polishing method.

13. A fabricating method according to claim 11, wherein the planarization method is a spin-on-glass method.

14. A fabricating method according to claim 1, wherein the first insulating layer in said step (c) is a silicon nitride layer formed by chemical vapor deposition followed by planarization.

15. A fabricating method according to claim 14, wherein the planarization method is a chemical mechanical polishing method.

16. A fabricating method according to claim 14, wherein the planarization method is a spin-on-glass method.

17. A fabricating method according to claim 1, wherein the spaced wall in said step (e) is a silicon oxide layer.

18. A fabricating method according to claim 1, wherein the spaced wall is said step (e) is a silicon oxide layer.

19. A fabricating method according to claim 1, wherein the conducting layer in step (h) is a heavily doped polysilicon layer.

20. A fabricating method according to claim 1, wherein the conducting layer in step (h) is a metal layer.

21. A fabricating method according to claim 1, wherein the first direction is perpendicular to the second direction.

* * * * *

UNITED STATES PATENT AND TRADEMARK OFFICE
CERTIFICATE OF CORRECTION

PATENT NO.      : 5,904,527
DATED           : May 18, 1999
INVENTOR(S)     : Jemmy Wen It is certified that error appears in the above-identified patent and that said Letters Patent is hereby corrected as shown below:

<u>Title page,</u>
"[76] Inventor: Jemmy Wen, Hsinchu. Taiwan" should read
-- [75] Inventor: Jemmy Wen, Hsinchu City, Taiwan
   [73] Assignee: United Microeletronics Corporation, Taiwan --.

Item [22], "Aug. 4, 1997" should read -- Aug. 5, 1997 --.

Be*low* "*Primary Examiner* - Chandra Chaudhari", insert
-- *Attorney, Agent or Firm* - Finnegan, Henderson, Farabow, Garrett & Dunner, L.L.P. --.

Signed and Sealed this

Twelfth Day of February, 2002

*Attest:*

*Attesting Officer*

JAMES E. ROGAN
*Director of the United States Patent and Trademark Office*